United States Patent
Chi et al.

(10) Patent No.: US 11,646,315 B2
(45) Date of Patent: May 9, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Shuaijie Chi, Shanghai (CN); Haiyang Zhang, Shanghai (CN); Ermin Chong, Shanghai (CN); Wei Tian, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 30 days.

(21) Appl. No.: 17/322,472

(22) Filed: May 17, 2021

(65) Prior Publication Data
US 2021/0358912 A1    Nov. 18, 2021

(30) Foreign Application Priority Data
May 18, 2020  (CN) .......................... 202010420701.6

(51) Int. Cl.
| | | |
|---|---|---|
| H01L 27/092 | (2006.01) | |
| H01L 29/66 | (2006.01) | |
| H01L 21/8234 | (2006.01) | |
| H01L 29/06 | (2006.01) | |

(52) U.S. Cl.
CPC .. H01L 27/0924 (2013.01); H01L 21/823431 (2013.01); H01L 21/823481 (2013.01); H01L 29/0653 (2013.01); H01L 29/6681 (2013.01)

(58) Field of Classification Search
CPC ......... H01L 27/0924; H01L 21/823431; H01L 21/823481; H01L 29/0653; H01L 29/6681
See application file for complete search history.

(56) References Cited

U.S. PATENT DOCUMENTS

| | | | |
|---|---|---|---|
| 10,176,995 B1* | 1/2019 | Wu | .................... H01L 21/02274 |
| 2019/0067115 A1* | 2/2019 | Park | .................... H01L 27/0924 |
| 2020/0127113 A1* | 4/2020 | Ching | ............... H01L 29/66545 |

* cited by examiner

*Primary Examiner* — Christine A Enad
(74) *Attorney, Agent, or Firm* — Anova Law Group, PLLC

(57) ABSTRACT

Semiconductor structures and fabrication methods thereof are provided. The semiconductor includes a substrate; a gate structure on the substrate; and a dielectric layer on the substrate and covering sidewall surfaces of the gate structure. The dielectric layer includes an opening passing through the gate structure along a direction perpendicular to an extending direction of the gate structure. The semiconductor structure also includes a first isolation layer in the opening and with a top surface lower than a top surface of the gate structure.

17 Claims, 7 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202010420701.6, filed on May 18, 2020, the content of which is incorporated by reference in its entirety.

TECHNICAL FIELD

The present disclosure generally relates to the field of semiconductor manufacturing technology and, more particularly, relates to semiconductor structures and fabrication methods.

BACKGROUND

The semiconductor manufacturing industry has experienced an exponential growth. Technological advances in semiconductor materials and designs have produced multiple generations, each of which has smaller and more complex circuits than the previous generation. During the development of semiconductor technology, the functional density (i.e., the number of interconnected devices per chip area) has generally increased, while the geometric size (i.e., the smallest component/line that can be produced using manufacturing processes) has been reduced. This scaling down process usually provides benefits by increasing production efficiency and reducing associated costs.

This scaling down process also increases the complexity of processing and manufacturing the semiconductor devices, and to achieve these advances, more sophisticated process technologies have been developed. For example, the traditional gate dicing process is greatly limited by the dense packaging of devices required by advanced semiconductor process nodes. Specifically, the gate dicing process usually implements an etching process that completely (or substantially) removes the entire part of the gate stack (including, for example, at least one gate electrode layer and at least one gate dielectric layer). However, the lateral etching generated during the gate dicing process or the isolation structure formed after the gate dicing process will affect the performance of the semiconductor device.

Therefore, there is a need to improve the gate dicing process to improve the performance of the semiconductor device. The disclosed methods and semiconductor structures are directed to solve one or more problems set forth above and other problems in the art.

SUMMARY

One aspect of the present disclosure provides a semiconductor structure. The semiconductor structure may include a substrate; a gate structure on the substrate; and a dielectric layer on the substrate and covering sidewall surfaces of the gate structure. The dielectric layer may include an opening passing through the gate structure along a direction perpendicular to an extending direction of the gate structure. The semiconductor may also include a first isolation layer in the opening and with a top surface lower than a top surface of the gate structure.

Optionally, a material of the first isolation layer includes a dielectric material; and the dielectric material includes silicon nitride.

Optionally, the semiconductor structure further includes a second isolation layer in the opening and on the first isolation layer. A material of the second isolation layer is different from the material of the first isolation layer, and the material layer of the second isolation layer is same as a material of the dielectric layer.

Optionally, the substrate includes a semiconductor substrate and a plurality of fins on the semiconductor substrate; the gate structure is across the plurality of fins; and the first isolation layer is located between adjacent fins of the plurality of fins.

Optionally, the semiconductor further includes doped source/drain regions in the plurality fins at two sides of the gate structure; and a metal layer in the dielectric layer. The metal layer is electrically connected to doped source/drain regions at one side of the gate structure, and the metal layer is on the first isolation layer.

Optionally, the metal layer is parallel with the gate structure.

Another aspect of the present disclosure provides a method for forming a semiconductor structure. The method includes providing a substrate; forming a dummy gate structure on the substrate; forming a dielectric layer on the substrate, wherein the dielectric layer is on sidewall surfaces of the dummy gate structure and exposes a top surface of the dummy gate structure; forming an opening in the dielectric layer, wherein, along a direction perpendicular to an extending direction of the dummy gate structure, the opening passes through the dummy gate structure; and forming a first isolation layer in the opening, wherein a top surface of the first isolation layer is lower than a top surface of the dummy gate structure.

Optionally, a material of the first isolation layer includes a dielectric material; and the dielectric material includes silicon nitride.

Optionally, the method for forming the first isolation layer includes forming a first isolation material layer in the opening; and etching back the first isolation material layer until the sidewall surfaces of the dummy gate structure are exposed to cause the top surface of the first isolation layer to be lower than the top surface of the dummy gate structure.

Optionally, after forming the first isolation layer, the method further includes forming a second isolation layer on the first isolation layer. The second isolation layer is in the opening, a material of the second isolation layer is different from a material of the first isolation layer, and the material of the second isolation layer is same as a material of the dielectric layer.

Optionally, the material of the second isolation layer includes a dielectric material; and the dielectric material includes silicon oxide.

Optionally, the substrate includes a semiconductor substrate and a plurality of fins on the substrate; and the dummy gate structure is across the plurality of fins.

Optionally, after forming the dummy gate structure and before forming the dielectric layer, the method further includes forming doped source/drain regions in the plurality of fins at two sides of the gate structure.

Optionally, after forming the second isolation layer, the method further includes removing a portion of the second isolation layer and a portion of the dielectric layer to form a trench in the dielectric layer to expose surfaces of the doped source/drain regions at the one side of the gate structure and the surface of the first isolation layer; and forming a metal layer in the trench, wherein the metal layer is electrically connected with the doped source/drain regions at the one side of the dummy gate structure.

Optionally, before removing the portion of the second isolation layer and the portion of the dielectric layer to form the trench, the method further includes removing the dummy gate structure to form a gate opening in the dielectric layer; and forming the gate structure in the gate opening. The gate structure includes an effective gate structure and an ineffective gate structure.

Optionally, before removing the portion of the second isolation layer and the portion of the dielectric layer, the method further includes removing the ineffective gate structure.

Optionally, a process for removing the ineffective gate structure includes a wet etching process.

Optionally, the metal layer is parallel to the dummy gate structure.

Optionally, the method for forming the second isolation layer includes forming a second isolation material layer on the first isolation layer and the dielectric layer; and planarizing the second isolation material layer until the surface of the dielectric layer is exposed to form the second isolation layer.

Optionally, the method for forming the opening includes forming a patterned mask layer on a top surface of the dummy gate structure and a surface of the dielectric layer, wherein the patterned mask layer exposes a portion of the top surface of the dielectric layer and a portion of the surface of the dielectric layer; and etching the dummy gate structure and the dielectric layer using the patterned mask layer as an etching mask to form the opening in the dielectric layer and the dummy gate structure.

The present disclosure may have the following beneficial effects.

In the present disclosed semiconductor structure, the dielectric layer may have an opening. The opening may pass through the gate structure along a direction perpendicular to the extending direction of the gate structure. A first isolation layer may be formed in the opening and the top surface of the first isolation layer may be lower than the top surface of the gate structure. Thus, in the subsequent process for forming the metal layer, the metal layer may be across the first isolation layer. Because the height of the first isolation layer may be relatively low, the resistance of the metal layer may be relatively low. Accordingly, the performance of the semiconductor structure may be improved.

In the present disclosure method for forming a semiconductor structure, an opening may be formed in the dielectric layer, and the opening may pass through the dummy gate structure along a direction perpendicular to the extending direction of the initial dummy gate structure, and then a first isolation layer may be formed in the opening. The top surface of the first isolation layer may be lower than the top surface of the dummy gate structure. Thus, in the subsequent process for forming the metal layer, the metal layer may be across the first isolation layer. Because the height of the first isolation layer may be relatively low, the resistance of the metal layer may be relatively low. Accordingly, the performance of the semiconductor structure may be improved.

Further, after forming the first isolation layer, the method may further includes forming a second isolation layer on the first isolation layer. The second isolation layer may be located in the opening, and the material of the second isolation layer may be different from the material of the first isolation layer; and the material of the second isolation layer may be same as the material of the dielectric layer. Thus, when the trench exposing the doped source/drain regions are subsequently formed in the dielectric layer, the second isolation layer may also be removed together such that the metal layer may be formed on the first isolation layer and the resistance of the metal layer may be reduced.

Further, the opening may pass through the dummy gate structure along a direction perpendicular to the extending direction of the initial dummy gate structure such that the size of the opening may be greater than the width of the dummy gate structure. Accordingly, the wet etching process is subsequently used to remove the ineffective gate structure, the first isolation layer and the second isolation layer may protect the effective gate structure to prevent the etching solution for removing the ineffective gate structure from diffusing along the interface between the first isolation layer and the second isolation layer and the dielectric layer into the effective gate structure to damage the effective gate structure. Thus, the performance of the semiconductor structure may be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
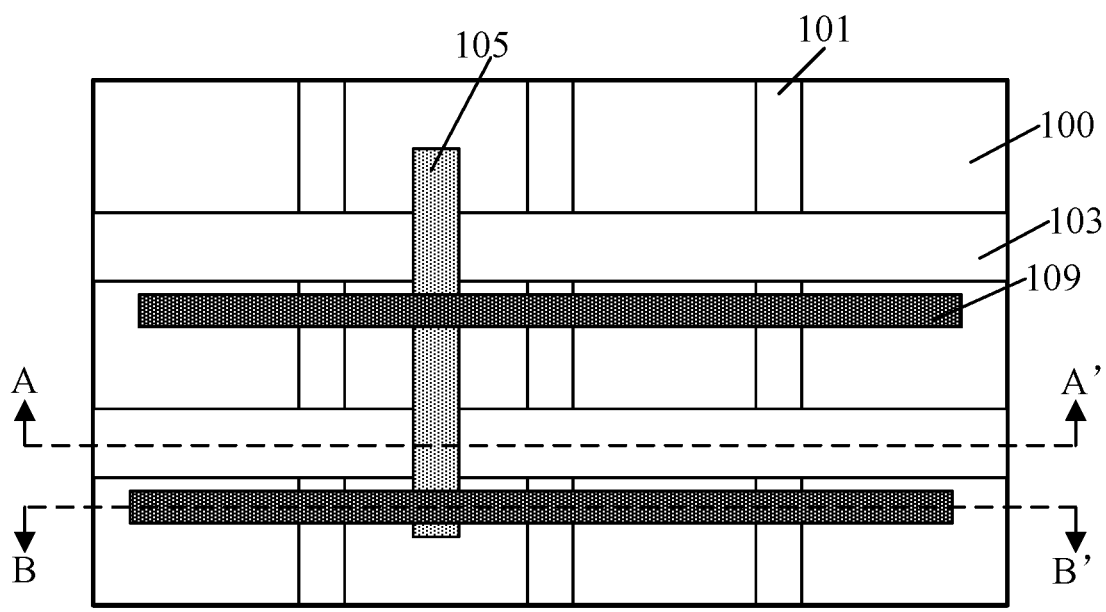
FIGS. 1-3 illustrate top and cross-sectional views of a semiconductor structure.
Figure 2:
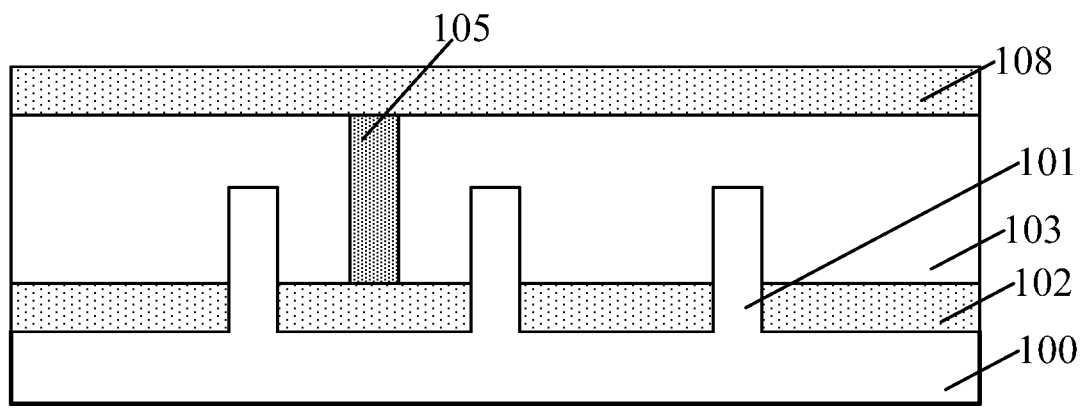
Figure 3:
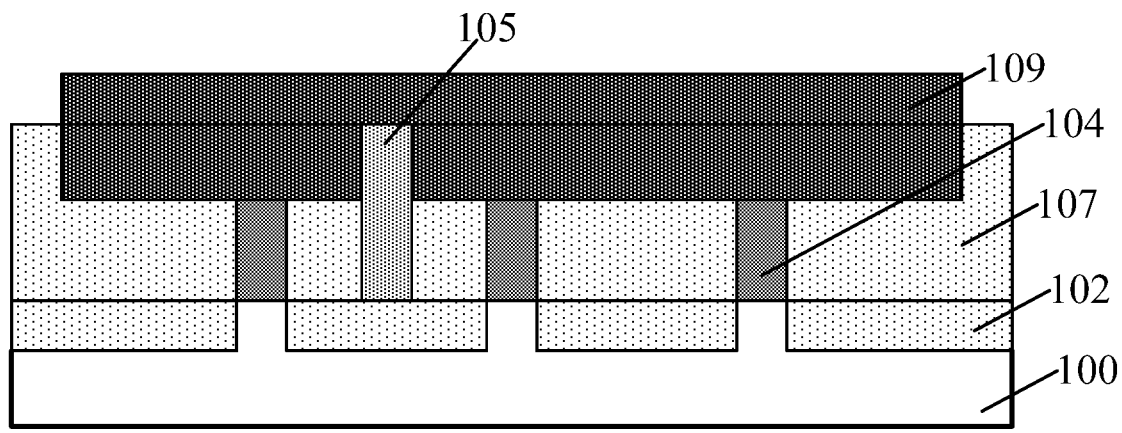

FIGS. 1-3 illustrate top and cross-sectional views of a semiconductor structure. FIG. 1 is top view of FIGS. 2-3 with omitting the first dielectric layer 107 and the second dielectric layer 108. FIG. 2 is an AA'-sectional view of FIG. 1; and FIG. 3 is a BB'-sectional view of FIG. 1.

As shown in FIGS. 1-3, the semiconductor structure includes a substrate 100 and a plurality of fins 101 on the substrate 100. The semiconductor structure also includes an isolation layer 102 on the substrate 100. The isolation layer 102 is also on portions of the sidewall surfaces of the fins 101. The top surface of the isolation layer 102 is lower than the top surfaces of the fins 101. Further, the semiconductor structure includes a gate structure 103 on the substrate 100. The gate structure 103 may be across the fins 101. Further, the semiconductor structure may include doped source/drain regions 104 in the fins 101 at both sides of the gate structure 103; a first dielectric layer 107 on the sidewall surfaces of the gate structure 103; an isolation structure 105 in the gate structure 103 and the first dielectric layer 107; and a metal layer 109 on the first dielectric layer 107. The metal layer 109 is electrically connected to the doped source/drain regions 103 at one side of the gate structure 103.

During forming the semiconductor structure, a dummy gate structure is first formed, and then a portion of the dummy gate structure is removed to form a first trench (not shown) in the dielectric layer 107. Then, a portion of the dielectric layer 107 exposed by the first trench is removed, and a second trench (not shown) connected to the first trench is formed in the dielectric layer 107, and an isolation structure 105 is formed in the first trench and the second trench. The material of the isolation structure 105 includes silicon nitride. Then, the dummy gate structure is removed to form the gate structure 103.

When forming the metal layer 109 electrically connected to the doped source/drain regions 104 on the side of the gate structure 103, during the process for removing the second dielectric layer 108 and the first dielectric layer 107 to expose the surface of the doped source/drain regions 104, the removal process may cause a less loss to the isolation structure 105. Thus, the formed metal layer 109 is across the isolation structure 105. The height of the isolation structure 105 is relatively high. On the one hand, the current path through the metal layer 109 becomes longer. On the other hand, the height of the metal layer 109 on the top of the isolation structure 105 is relatively small. Thus, the number of the electrons passing through the cross-sectional area of the metal layer 109 on the top of the structure 105 may be less. In summary, the resistance of the metal layer 109 may become larger, and the performance of the semiconductor structure may be adversely affected.

The present disclosure provides a semiconductor structure and a method for forming a semiconductor structure. In the method, an opening may be formed in the dielectric layer and the dummy gate structure, and the opening may pass through the dummy gate structure along the direction perpendicular to the extension direction of the initial dummy gate structure. Then, a first isolation layer may be formed in the opening, and the top surface of the first isolation layer may be lower than the top surface of the dummy gate structure. Therefore, in the subsequent process for forming the metal layer, the metal layer may be across the first isolation layer. Because the height of the first isolation layer may be substantially small, the resistance of the metal layer may be relatively low. Accordingly, the performance of the semiconductor structure may be improved.

To make the above-mentioned objectives, features and beneficial effects of the present disclosure more obvious and understandable, specific embodiments of the present disclosure will be described in detail below in conjunction with the accompanying drawings.

Figure 13:
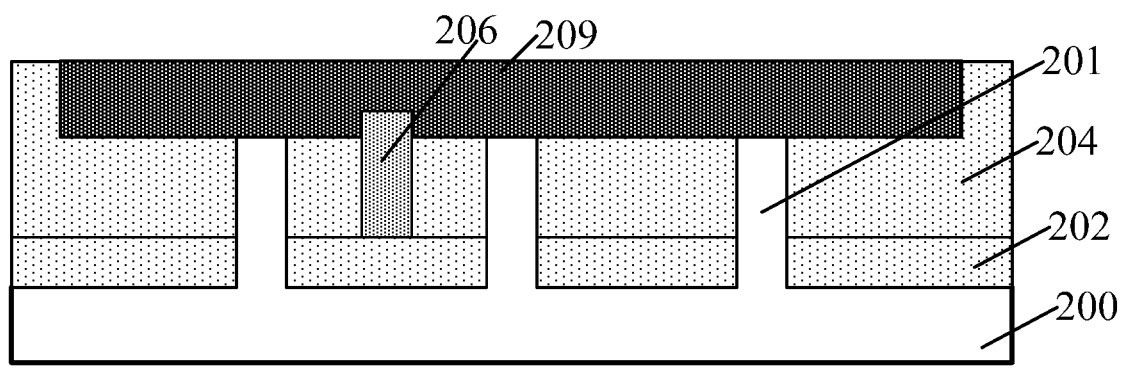
Figure 14:
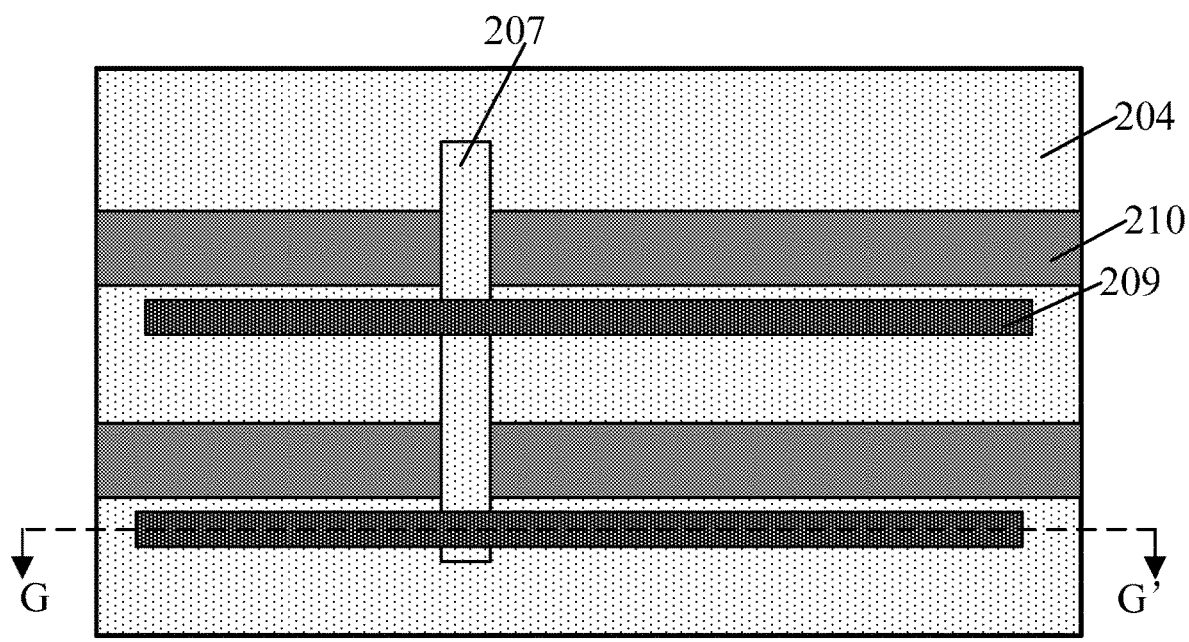
Figure 15:
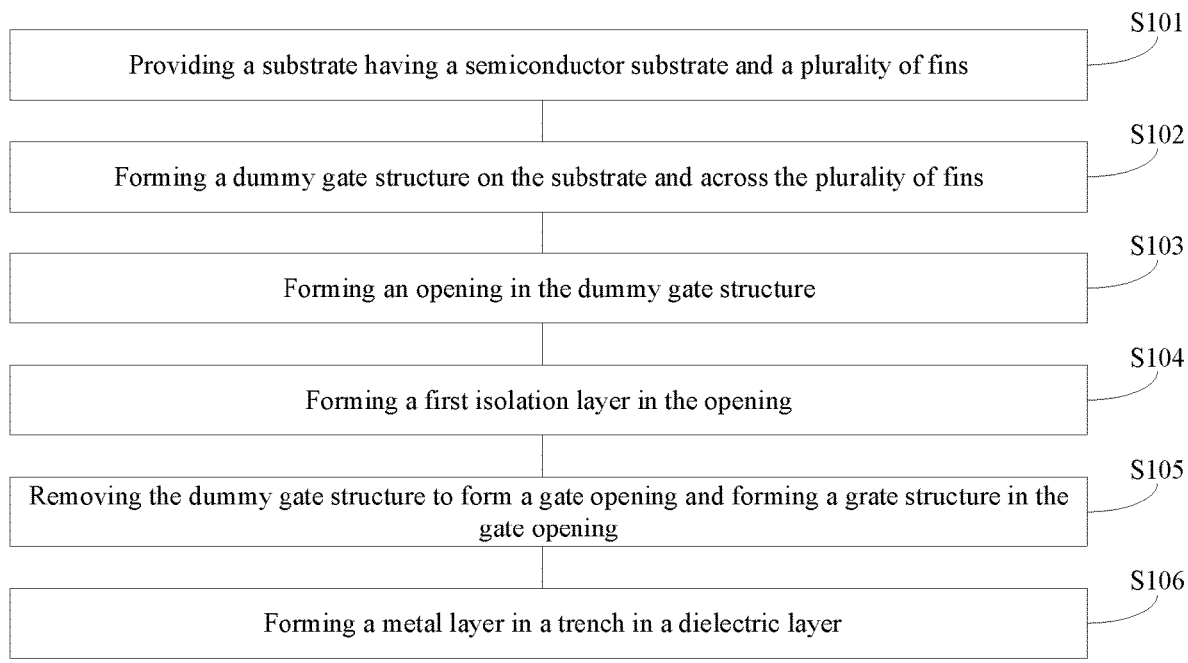
FIG. 15 illustrates an exemplary fabrication process of a semiconductor structure consistent with various disclosed embodiments of the present disclosure.

The present disclosure provides a method for forming a semiconductor structure. FIG. 15 illustrates an exemplary fabrication process of a semiconductor structure consistent with various disclosed embodiments of the present disclosure. FIGS. 4-14 illustrate structures corresponding to certain stages during the exemplary fabrication process consistent with various disclosed embodiments of the present disclosure.

Figure 4:
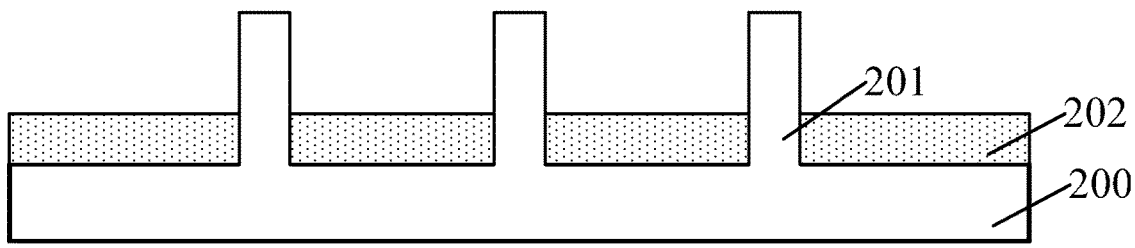
FIGS. 4-14 illustrate structures corresponding to certain stages during an exemplary fabrication process of a semiconductor structure consistent with various disclosed embodiments of the present disclosure.

As shown in FIG. 15, at the beginning of the fabrication process, a substrate is provided (S101). FIG. 4 illustrates a corresponding structure.

As shown in FIG. 4, a substrate is provided. The substrate may include a semiconductor substrate 200 and a plurality of fins 201 on the semiconductor substrate 200. The substrate may also include an isolation layer 202 formed on portions of the sidewall surfaces of the fins 201. The top surface of the isolation layer 202 may be lower than the top surfaces of the fins 201.

The material of the semiconductor substrate 200 may be single crystal silicon, etc. The material of the fins 201 may include single crystal silicon, etc.

In some embodiments, the substrate may also be made of a semiconductor material, such as polysilicon, germanium, silicon germanium, gallium arsenide, silicon-on-insulator, or germanium-on-insulator, etc. The fins may also be made of polysilicon, germanium, silicon germanium gallium arsenide, silicon-on-insulator, or germanium-on-insulator, or other semiconductor materials.

The material of the isolation layer 202 may include a dielectric material. The dielectric material may include one or more of silicon oxide, silicon nitride, silicon oxynitride, aluminum oxide, aluminum nitride, silicon oxynitride, and silicon oxycarbonitride, etc. In one embodiment, the material of the isolation layer 202 includes silicon oxide.

Figure 5:
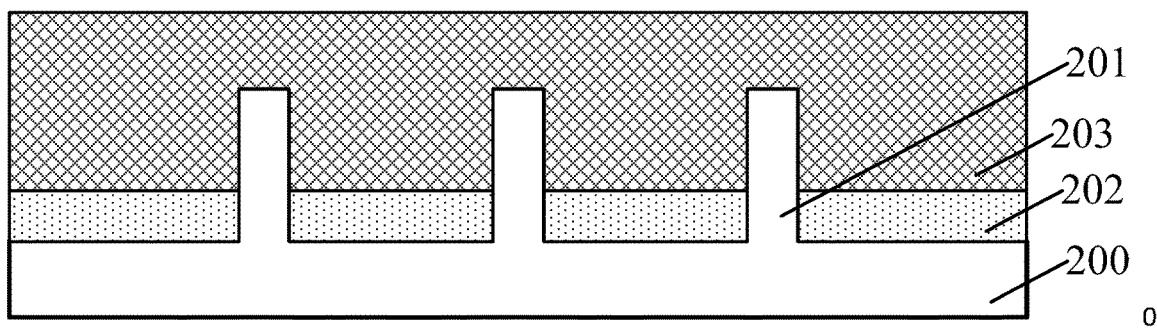
Figure 6:

Returning to FIG. 15, after providing the substrate, a dummy gate structure may be formed (S102). FIGS. 5-6 illustrate a corresponding structure. FIG. 6 is a top view of FIG. 5, and FIG. 5 is a CC'-sectional view of FIG. 6.

As shown in FIG. 6, a dummy gate structure 203 may be formed on the substrate. The dummy gate structure 203 may be across the plurality of the fins 201.

The dummy gate structure 203 may include a dummy gate dielectric layer (not shown) and a dummy gate layer (not shown) on the dummy gate dielectric layer.

The method for forming the dummy gate structure 203 may include forming a dummy gate dielectric material layer (not shown) on the substrate; forming a dummy gate material layer (not shown) on the dummy gate dielectric material layer; forming a patterned mask layer (not shown) on the dummy gate material layer; and etching the dummy gate material layer and the dummy gate dielectric material layer using the patterned mask layer as a mask until the surface of the substrate is exposed. Accordingly, the dummy gate structure 203 may be formed.

The material of the dummy gate dielectric layer may include silicon oxide, or low-K (K is less than 3.9) material. The material of the dummy gate layer may include polysilicon, etc.

Further, referring to FIGS. 5-6, doped source/drain regions (not shown) may be formed in the fins 201 at both sides of the dummy gate structure 203.

The doped source/drain regions may have doping ions. The type of the doping ions may be N-type or P-type. The N-type ions may include phosphorus ions, or arsenic ions, etc. The P-type ions may include boron ions, or indium ions, etc.

The process for forming the doped source/drain regions may include an epitaxial growth process, or an ion implantation process, etc.

Further, referring to FIGS. 5-6, a dielectric layer 204 may be formed on the substrate. The dielectric layer 204 may be formed on the sidewall surfaces of the dummy gate structure 203, and the dielectric layer 204 may expose the top surface of the dummy gate structure 203.

The method for forming the dielectric layer 204 may include forming a dielectric material layer (not shown) on the substrate, and the top surface and sidewall surfaces of the dummy gate structure 203; and planarizing the dielectric material layer until the top surface of the gate structure 203 is exposed. Accordingly, the dielectric layer 204 may be formed.

The material of the dielectric layer 204 may include a dielectric material. The dielectric material may include one or more of silicon oxide, silicon nitride, silicon oxynitride, silicon carbide, silicon carbonitride, and silicon oxycarbonitride, etc. The process for forming the dielectric material layer may include a chemical vapor deposition process, a heat treatment process, or an atomic layer deposition process, etc.

In one embodiment, the material of the dielectric layer 204 may include silicon oxide; and the process for forming the dielectric material layer may include a chemical vapor deposition process, etc.

Figure 7:
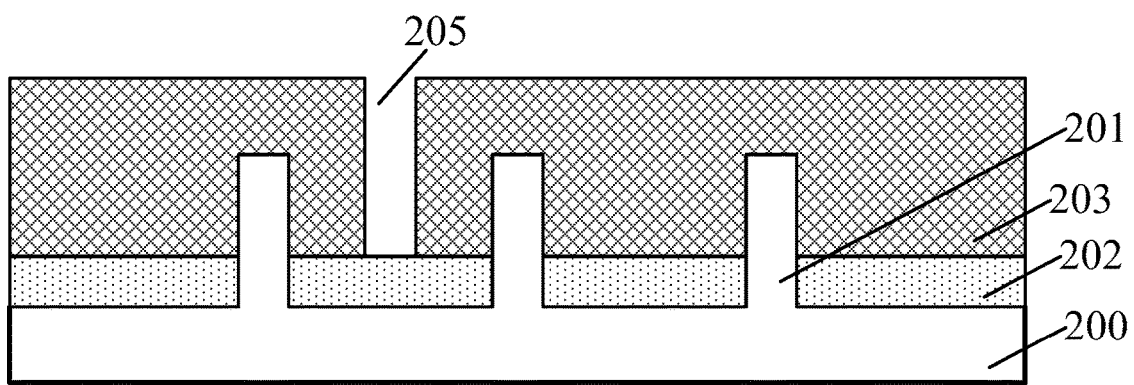
Figure 8:
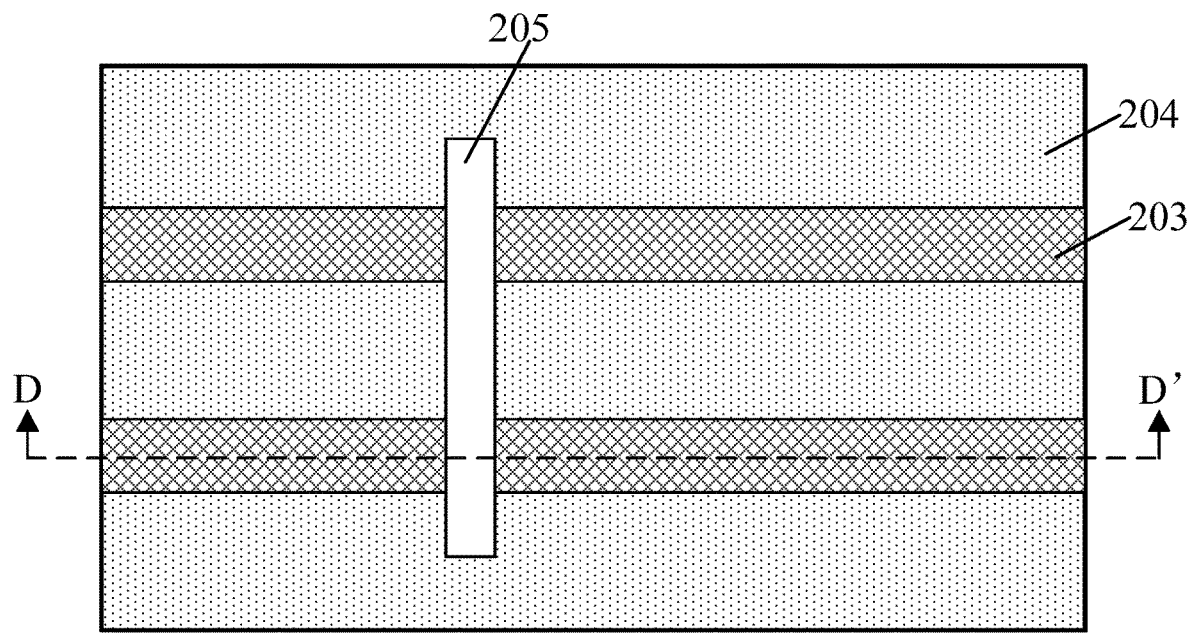

Returning to FIG. 15, after forming the dummy gate structure, an opening may be formed (103). FIGS. 7-8 illustrate a corresponding structure. FIG. 8 is a top view of FIG. 7, and FIG. 7 is a DD'-sectional view of FIG. 8.

As shown in FIGS. 7-8, an opening 205 may be formed in the dielectric layer 204 and the dummy gate structure 203. The opening 205 may pass through the dummy gate structure 203 along a direction perpendicular to the extending (length) direction of the dummy gate structure 203.

The opening 205 may pass through the dummy gate structure 203 along a direction perpendicular to the extending direction of the dummy gate structure 203 such that, after forming the first isolation layer and the second isolation layer and removing the dummy gate structure to form an effective gate structure and an ineffective gate structure, the first isolation layer and the second isolation layer may protect the effective gate structure when a wet etching process is used to remove the ineffective gate structure. Accordingly, the etching solution for removing the ineffective gate structure may be prevented from penetrating to the effective gate structure through the interface between the first isolation layer and the second isolation layer and the dielectric layer 204 to damage the effective gate structure. Thus, the performance of the semiconductor structure may be improved.

The method for forming the opening 205 may include forming a patterned mask structure (not shown) on the top surface of the dummy gate structure 203 and the surface of the dielectric layer 204. The patterned mask structure may expose a portion of the top surface of the dummy gate structure 203 and the surface of the dielectric layer 204. The the dummy gate structure 203 and the dielectric layer 204 may be etched using the patterned mask structure as a mask to form the opening 205 in the dielectric layer 204 and the dummy gate structure 203.

In one embodiment, the dummy gate structure 203 exposed by the patterned mask structure may be removed first to form an initial opening (not shown), and then the dielectric layer 204 exposed by the initial opening and the patterned mask structure 204 may be removed to form the opening 205. Thus, the dummy gate structure 203 and the dielectric layer 204 in the opening 205 may be completely removed, and the opening 205 with a substantially accurate size and desired morphology may be formed.

The process for removing the dummy gate structure 203 exposed by the patterned mask structure may include one or a combination of a dry etching process and a wet etching process. The process for removing the dielectric layer 204 exposed by the initial opening and the patterned mask structure may include one or a combination of a dry etching process and a wet etching process.

In one embodiment, the process for removing the dummy gate structure 203 exposed by the patterned mask structure includes a dry etching process; and the process for removing the dielectric layer 204 exposed by the patterned mask structure in the initial opening may include a dry etching process.

Figure 9:
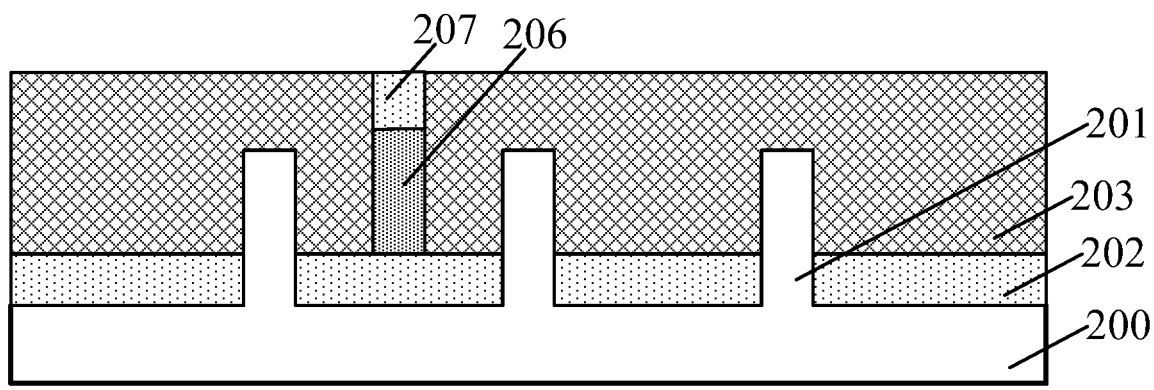
Figure 10:
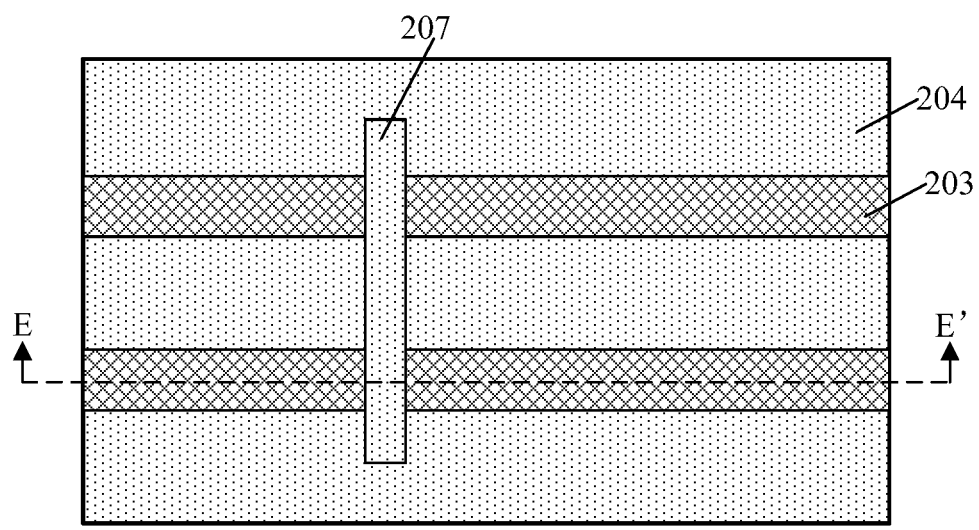

Returning to FIG. 15, after forming the opening, a first isolation layer may be formed (S104). FIGS. 9-10 illustrate a corresponding structure. FIG. 10 is a top view of FIG. 9, and FIG. 9 is an EE'-sectional view of FIG. 10.

As shown in FIGS. 9-10, a first isolation layer 206 may be formed in the opening 205. The top surface of the first isolation layer 206 may be lower than the top surface of the dummy gate structure 203.

The top surface of the first isolation layer 206 may be lower than the top surface of the dummy gate structure 203. Thus, in the subsequent process for forming a metal layer, the metal layer may be across the first isolation layer 206. Accordingly, the height of the isolation layer 206 may be reduced, and the resistance of the metal layer may be relatively small. Thus, the performance of the semiconductor structure may be enhanced.

In one embodiment, the top surface of the first isolation layer 206 may be slightly higher than the top surface of the fins 201 such that, in the case of reducing the resistance of the metal layer, the first isolation layer 206 and the subsequently formed second isolation layer may have a better blocking effect on the etching solution for removing the ineffective gate structure. Accordingly, an effective gate structure with less damage may be subsequently formed, and the performance of the effective gate structure may be improved.

In some embodiments, the top surface of the first isolation layer may also be lower than or flush with the top surface of the fins.

The method for forming the first isolation layer 206 may include forming a first isolation material layer (not shown) in the opening 205; and etching back the first isolation material layer until the sidewall surfaces of the dummy gate structure 203 are exposed to make the top surface of the first isolation layer 206 lower than the top surface of the dummy gate structure 203.

The material of the first isolation layer 206 may include a dielectric material. The dielectric material may include one or more of silicon oxide, silicon nitride, silicon oxynitride, aluminum oxide, aluminum nitride, silicon carbonitride, and silicon oxycarbonitride, etc. The process for forming the first isolation material layer may include a chemical vapor deposition process, or an atomic layer deposition process, etc.

In one embodiment, the material of the first isolation layer 206 includes silicon nitride; and the process for forming the first isolation material layer includes a chemical vapor deposition process.

Further, referring to FIGS. 9-10, a second isolation layer 207 may formed on the first isolation layer 206. The second isolation layer 207 may be formed in the opening 205.

The material of the second isolation layer 207 may be different from the material of the first isolation layer 206, and the material of the second isolation layer 207 may be same as the material of the dielectric layer 204. Thus, when trenches exposing the doped source/drain regions are subsequently formed in the dielectric layer 204, the second isolation layer 207 may also be removed together such that the metal layer may be formed on the first isolation layer and the resistance of the metal layer may be reduced.

A second isolation layer 207 may be formed on the first isolation layer 206, and the material of the second isolation layer 207 may be different from the material of the first isolation layer 206. Accordingly, while the first isolation layer 206 and the second isolation layer 207 play a good isolation role, the formed semiconductor device (such as a transistor) may have a small threshold voltage.

The method for forming the second isolation layer 207 may include forming a second isolation material layer (not shown) on the first isolation layer 206 and the dielectric layer 204; and planarizing the second isolation material layer until the top surface of the dielectric layer 204 is exposed to form the second isolation layer 207.

The material of the second isolation layer 207 may include a dielectric material. The dielectric material may include one or more of silicon oxide, silicon nitride, silicon oxynitride, aluminum oxide, aluminum nitride, silicon carbonitride, and silicon oxycarbonnitride. The process for forming the second isolation material layer may include a chemical vapor deposition process, or an atomic layer deposition process, etc. In one embodiment, the material of the second isolation layer 207 includes silicon nitride; and the process for forming the second isolation material layer includes a chemical vapor deposition process.

Figure 11:
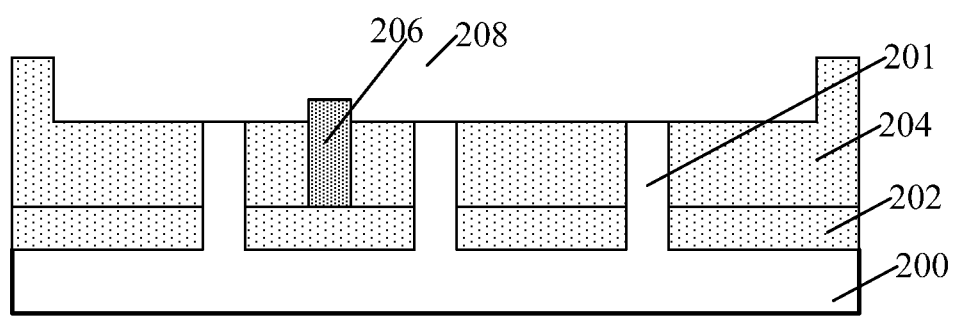
Figure 12:
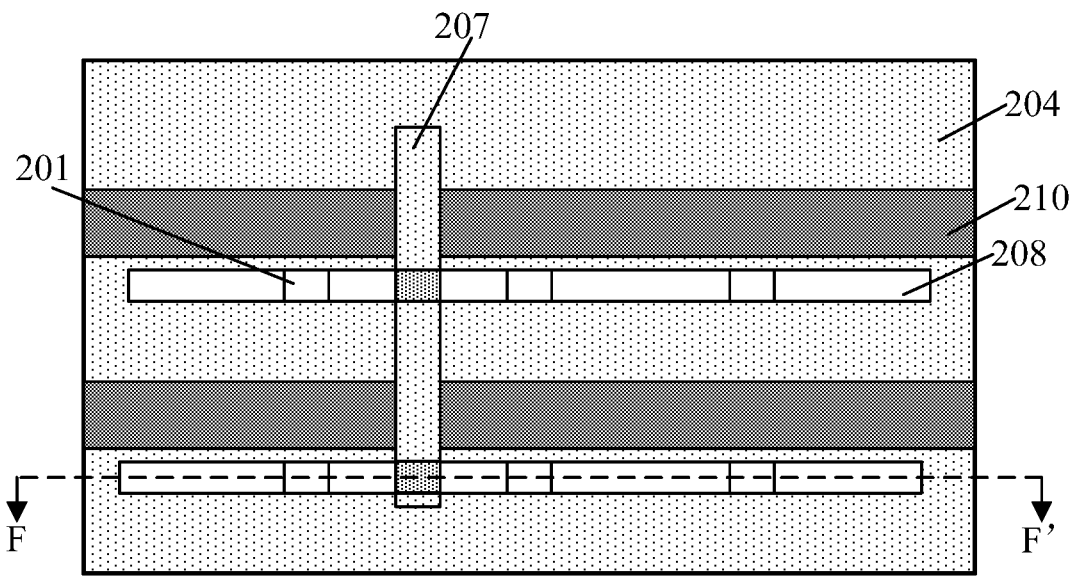

Returning to FIG. 15, after forming the first isolation layer, the dummy gate structure may be removed (S105). FIGS. 11-12 illustrate a corresponding structure. FIG. 12 is a top view of FIG. 11, and FIG. 11 is an FF'-sectional view of FIG. 12.

As shown in FIGS. 11-12, the dummy gate structure 203 may be removed, and a gate opening (not shown) may be formed in the dielectric layer 204. Further, a gate structure may be formed in the gate opening.

In one embodiment, the gate structure may include an effective gate structure 210 and an ineffective gate structure (not shown). The effective gate structure 210 and the ineffective gate structure may be located at two sides of the first isolation layer 206 and the second isolation layer 206.

The effective gate structure 210 may include a gate dielectric layer (not shown) and a gate layer (not shown) on the gate dielectric layer.

In this embodiment, the effective gate structure 210 may further include a work function layer (not shown). The work function layer may be located between the gate dielectric layer and the gate layer.

The material of the gate dielectric layer may include a high dielectric constant material. The dielectric constant of the high dielectric constant material may be greater than 3.9. The high dielectric constant material may include aluminum oxide, or hafnium oxide, etc. The material of the gate layer may include metal material. The metal material may include tungsten. The material of the work function layer may include an N-type work function material or a P-type work function material. The N-type work function material may include titanium aluminum, and the P-type work function material may include titanium nitride, or tantalum nitride.

Further, referring to FIGS. 11-12, after forming the gate structure, the ineffective gate structure may be removed. In one embodiment, the process for removing the ineffective gate structure may include a wet etching process.

Because the opening 205 may pass through the dummy gate structure 203 along a direction perpendicular to the extending direction of the dummy gate structure 203, the size of the opening 205 may be greater than the width of the dummy gate structure 203. Thus, when a wet etching process is used to remove the ineffective gate structure, the first isolation layer 206 and the second isolation layer 207 formed in the opening 205 may protect the effective gate structure 210, and may prevent the etching solution for removing the ineffective gate structure from permeating along the interface between the first isolation layer 206 and the second isolation layer 207 and the dielectric layer 204 to the effective gate structure 210 to damage the effective gate structure 210. Accordingly, the performance of the semiconductor structure may be enhanced.

In some embodiments, the ineffective gate structure may not be removed.

Further, refer to FIGS. 11-12, an interlayer dielectric layer (not shown) may be formed on the top surface of the gate structure, the surface of the dielectric layer 204, and the surface of the second isolation layer 207. A portion of the interlayer dielectric layer and the second isolation layer 207 and the dielectric layer 204 may be removed to form a trench 208 in the dielectric layer 204. The trench 208 may expose the surfaces of the doped source/drain regions at one side of the gate structure 210 and the surface of the first isolation layer 206.

The method for forming the trench 208 may include forming a patterned mask layer (not shown) on the dielectric layer 204, the second isolation layer 207, and the gate structure 210 to expose a portion of the surface of the second isolation layer 207 and portions of the surface of the dielectric layer 204 on the doped source/drain regions. Then, the second isolation layer 207 and the dielectric layer 204 may be etched using the patterned mask layer as a mask until the surfaces of the doped source/drain regions are exposed to form the trench 208.

Because the material of the second isolation layer 207 may be same as the material of the dielectric layer 204, the second isolation layer 207 may also be removed when the trench 208 exposing the doped source/drain regions is formed in the dielectric layer 204. Thus, a metal layer may be subsequently formed on the first isolation layer 206; and the resistance of the metal layer may be reduced.

Returning to FIG. 15, after removing the dummy gate structure to form the trench, a metal layer may be formed (S106). FIGS. 13-14 illustrate a corresponding structure. FIG. 14 is a top view of FIG. 13, and FIG. 13 is a GG'-sectional view of FIG. 14.

As shown in FIGS. 13-14, a metal layer 209 may be formed in the trench 208. The metal layer 209 may be electrically connected with the doped source/drain regions at one side of the gate structure 210. The metal layer 209 may be parallel to the gate structure 210, and the top surface of the metal layer 209 may be higher than the top surface of the gate structure 210.

The method for forming the metal layer 209 may include forming a metal material layer (not shown) in the trench 208 and on the dielectric layer 204; and planarizing the metal material layer until the surface of the dielectric layer 204 is exposed to form the metal layer 209.

The material of the metal layer 209 may include one or more of copper, aluminum, tungsten, cobalt, and titanium nitride, etc. The process for forming the metal material layer may include a chemical vapor deposition process, a physical vapor deposition process, or an electroplating process, etc. In one embodiment, the material of the metal layer 209 includes copper; and the process for forming the metal material layer includes a physical vapor deposition process.

The metal layer 209 may be electrically connected to the doped source/drain regions, the metal layer 209 may be across the first isolation layer 206, and the top surface of the first isolation layer 206 may be lower than the gate structure 210. The height of the first isolation layer 206 may be relatively low, and the resistance of the metal layer 209 may be relatively small. Thus, the performance of the semiconductor structure may be improved.

Further, the present disclosure also provides a semiconductor structure. FIGS. 13-14 illustrate an exemplary semiconductor structure consistent with various disclosed embodiments of the present disclosure.

As shown in FIGS. 13-14, the semiconductor structure may include a substrate; a gate structure 210 on the substrate; a dielectric layer 204 on the substrate and the sidewall surfaces of the gate structure 210; an opening (not shown) in the gate structure 210 and the dielectric layer 204, and passing through the gate structure 210 along a direction perpendicular to the extending direction the gate structure 210; and a first isolation layer 206 in the opening and with a top surface lower than the top surface of the gate structure 210.

In one embodiment, the material of the first isolation layer 206 may include a dielectric material, etc. The dielectric material may include silicon nitride, etc.

In one embodiment, the semiconductor structure may further include a second isolation layer 207 in the opening. The second isolation layer 207 may be on the first isolation layer 206, and the second isolation layer 207 may be in the opening. The material of the second isolation layer 207 may be different from the material of the first isolation layer 206, and the material of the second isolation layer 207 may be same as the material of the dielectric layer 204.

In one embodiment, the substrate may include a semiconductor substrate 200 and a plurality of fins 201 on the semiconductor substrate 200. The gate structure 210 may be across the plurality of fins 201; and the first isolation layer 206 may be between adjacent fins 201.

In one embodiment, the semiconductor structure may further include doped source/drain regions (not shown) in the fins 201 at both sides of the gate structure 210; a metal layer 209 formed in the dielectric layer 204. The metal layer 209 may be electrically connected to the doped source/drain regions at one side of the gate structure 210, and the metal layer 209 may be formed on the first isolation layer 206. In one embodiment, the metal layer 209 may be parallel to the gate structure 210.

In the semiconductor structure, the gate structure 210 and the dielectric layer 204 may have the opening; the opening may pass through the gate structure 210 along the direction perpendicular to the extension direction of the gate structure 210, and the first isolation layer 206 may be in the opening. The top surface of the first isolation layer 206 may be lower than the top surface of the gate structure 210. Therefore, in the process of forming the metal layer 209, the metal layer 209 may be across the first isolation layer 206. Since the height of the first isolation layer 206 may be relatively low, the resistance of the metal layer 209 may be reduced. Accordingly, the performance of the semiconductor structure may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate including a semiconductor substrate and a plurality of fins on the semiconductor substrate;
   a gate structure on the substrate and across the plurality of fins;
   a dielectric layer on the substrate and covering sidewall surfaces of the gate structure, wherein the dielectric layer contains an opening passing through the gate structure along a direction perpendicular to an extending direction of the gate structure;
   a first isolation layer in the opening and with a top surface lower than a top surface of the gate structure;
   a second isolation layer in the opening and on the first isolation layer, a material of the second isolation layer being different from a material of the first isolation layer;
   doped source/drain regions in the plurality fins at two sides of the gate structure, wherein a trench is formed in the dielectric layer to expose surfaces of the doped source/drain regions at one side of the gate structure and the surface of the first isolation layer by removing a portion of the second isolation layer and a portion of the dielectric layer; and
   a metal layer in the trench, wherein the metal layer is electrically connected to doped source/drain regions at the one side of the gate structure.

2. The semiconductor structure according to claim 1, wherein:
   the material of the first isolation layer includes a dielectric material; and
   the dielectric material includes silicon nitride.

3. The semiconductor structure according to claim 1, wherein the material layer of the second isolation layer is same as a material of the dielectric layer.

4. The semiconductor structure according to claim 1, wherein:
   the first isolation layer is located between adjacent fins of the plurality of fins.

5. The semiconductor according to claim 1,
   wherein the metal layer is on the first isolation layer.

6. The semiconductor structure according to claim 1, wherein:
   the metal layer is parallel with the gate structure.

7. A method for forming a semiconductor structure, comprising:
   providing a substrate including a semiconductor substrate and a plurality of fins on the substrate;
   forming a dummy gate structure on the substrate and across the plurality of fins;
   forming doped source/drain regions in the plurality of fins at two sides of the dummy gate structure;
   forming a dielectric layer on the substrate, wherein the dielectric layer is on sidewall surfaces of the dummy gate structure and exposes a top surface of the dummy gate structure;
   forming an opening in the dielectric layer, wherein, along a direction perpendicular to an extending direction of the dummy gate structure, the opening passes through the dummy gate structure;
   forming a first isolation layer in the opening, wherein a top surface of the first isolation layer is lower than a top surface of the dummy gate structure;
   forming a second isolation layer on the first isolation layer and in the opening, a material of the second isolation layer being different from a material of the first isolation layer;
   removing a portion of the second isolation layer and a portion of the dielectric layer to form a trench in the dielectric layer to expose surfaces of the doped source/drain regions at the one side of the gate structure and the surface of the first isolation layer; and
   forming a metal layer in the trench, wherein the metal layer is electrically connected with the doped source/drain regions at the one side of the dummy gate structure.

8. The method according to claim 7, wherein:
the material of the first isolation layer includes a dielectric material; and
the dielectric material includes silicon nitride.

9. The method according to claim 7, wherein forming the first isolation layer comprises:
forming a first isolation material layer in the opening; and
etching back the first isolation material layer until the sidewall surfaces of the dummy gate structure are exposed to cause the top surface of the first isolation layer to be lower than the top surface of the dummy gate structure.

10. The method according to claim 7, wherein the material of the second isolation layer is same as a material of the dielectric layer.

11. The method according to claim 10, wherein:
the material of the second isolation layer includes a dielectric material; and
the dielectric material includes silicon oxide.

12. The method according to claim 7, before removing the portion of the second isolation layer and the portion of the dielectric layer to form the trench, further comprising:
removing the dummy gate structure to form a gate opening in the dielectric layer; and
forming the gate structure in the gate opening,
wherein the gate structure includes an effective gate structure and an ineffective gate structure.

13. The method according to claim 12, before removing the portion of the second isolation layer and the portion of the dielectric layer, further comprising:
removing the ineffective gate structure.

14. The method according to claim 13, wherein:
a process for removing the ineffective gate structure includes a wet etching process.

15. The method according to claim 7, wherein:
the metal layer is parallel to the dummy gate structure.

16. The method according to claim 7, wherein forming the second isolation layer comprises:
forming a second isolation material layer on the first isolation layer and the dielectric layer; and
planarizing the second isolation material layer until a surface of the dielectric layer is exposed to form the second isolation layer.

17. The method according to claim 7, wherein forming the opening comprises:
forming a patterned mask layer on a top surface of the dummy gate structure and a surface of the dielectric layer, wherein the patterned mask layer exposes a portion of the top surface of the dielectric layer and a portion of the surface of the dielectric layer; and
etching the dummy gate structure and the dielectric layer using the patterned mask layer as an etching mask to form the opening in the dielectric layer and the dummy gate structure.

* * * * *